United States Patent [19]

Kadota et al.

[11] 4,152,601
[45] May 1, 1979

[54] X-RAY LITHOGRAPHY MASK AND METHOD FOR MANUFACTURING THE SAME

[75] Inventors: Toshiki Kadota, Kodaira; Toshiro Ono, Tokorozawa; Katsumi Suzuki; Yasuo Iida, both of Tokyo, all of Japan

[73] Assignees: Nippon Telegraph & Telephone Public Corporation; Nippon Electric Co., Ltd., both of Tokyo, Japan

[21] Appl. No.: 843,485

[22] Filed: Oct. 19, 1977

[30] Foreign Application Priority Data

Oct. 19, 1976 [JP] Japan ............................ 51-125134

[51] Int. Cl.² .............................................. G03B 41/16
[52] U.S. Cl. .................................... 250/505; 250/320; 250/492 R
[58] Field of Search ................ 250/505, 514, 492 R, 250/493, 492 A, 320, 321, 323

[56] References Cited

U.S. PATENT DOCUMENTS

| | | | |
|---|---|---|---|
| 3,742,229 | 6/1973 | Smith | 250/492 A |
| 3,742,230 | 6/1973 | Spears | 250/505 |
| 3,743,842 | 7/1973 | Smith | 250/492 A |
| 3,873,824 | 3/1975 | Bean | 250/505 |

*Primary Examiner*—Craig E. Church
*Attorney, Agent, or Firm*—Hopgood, Calimafde, Kalil, Blaustein & Lieberman

[57] ABSTRACT

An x-ray lithography mask including a thick silicon peripheral rib with a window formed therein and a multi-layered membrane transparent to x-rays and visible light supported by the rib and covering the window. The membrane consists essentially of at least two silicon nitride layers and at least one silicon oxide layer sandwiched between the silicon nitride layers. The silicon nitride layers are preferably positioned at opposite surfaces of the multi-layered membrane.

16 Claims, 8 Drawing Figures

X-RAY LITHOGRAPHY MASK AND METHOD FOR MANUFACTURING THE SAME

BACKGROUND OF THE INVENTION

1. Field of the Invention

This invention relates to an X-ray lithography mask and a method for manufacturing the same, and more particularly to an X-ray lithography mask which is suited for use in the manufacture of a semiconductor device such as a very large scale integrated circuit (VLSI) having a submicron pattern.

2. Description of the prior art

Before X-ray lithography came to be widely used, the lithography technology resorted to was the so-called photolithography which employed an ultra-violet ray emitted from a high pressure mercury vapor lamp and the like. Due to the fact that a minute pattern, on the order of a submicron is often desired, photolithography can no longer be realistically resorted to because of the diffraction effect and the diffusion effect of an ultra-violet ray in the photo-resist. The lithography technique which is now used instead of this outdated technology is the so-called x-ray lithography which utilizes rays of a shorter wave length than ultra-violet rays.

In the case of X-ray lithography, an X-ray lithography mask, adapted to employ a shadow printing technique similar to the photolithographic technique, is placed between an X-ray source and an object to be exposed. X-ray flux is then irradiated over the entire area of the mask and an X-ray-sensitive material film, namely an X-ray resist film, formed on the object, is thereby selectively exposed to the X-ray. In this manner a submicron pattern, formed on the mask, can be transferred to the object. An X-ray provides greater penetrating power to a material than does an electron or photon beam and hence is not susceptible to scattering or reflection depending on the kinds of materials used. Therefore, X-ray lithography allows an increase in the resist thickness while retaining desired resolution. This leads to an improvement in reliability of an etching mask in a subsequent etching process. A description of fundamental X-ray lithography techniques is given in U.S. Pat. No. 3,743,842 and in the "Proceedings Of The IEEE" Vol. 62, No. 10, Oct. 1974, pages 1361 to 1387.

X-ray lithography is an effective process for manufacturing a semiconductor device, and especially for manufacturing VLSI VLIC having a submicron pattern. However, the following requirements must be met when using the X-ray lithography technique:

(i): A mask alignment must be made accurately and easily.

(ii): The mask membrane on which the mask pattern is formed, must be strong and the mask area, in other words the membrane area, must be large.

In general, in the manufacture of semiconductor devices, a set of at least four to eight lithography masks having different patterns are used. An important step in the manufacture of the semiconductor devices is so-called mask alignment, in which one pattern of a lithography mask is laid on another pattern of a lithography mask, while retaining a given positional relationship. In addition to the accuracy of the lithography mask itself, accuracy, operability of alignment, and product yield have great influence on the success of manufacturing semiconductor devices such as VLSI's.

The finer the pattern to be transferred, the higher alignment accuracy required. The higher alignment accuracy required, the lower operability and yield of product. The alignment accuracy required in general is on the order of less than 1/10 of the minimum line width of a pattern. For instance, in a high quality VLSI an alignment accuracy of at least ±0.1 to 0.3 $\mu$m is required.

In the prior art X-ray lithography mask disclosed in U.S. Pat. No. 3,742,230, a X-ray transmissive layer, namely a membrane, carrying a X-ray absorbing layer, constituting a submicron pattern, is made of a silicon film that is opaque to visible lights. This X-ray transmissive layer is supported by a silicon rib and doped with an impurity element having a smaller covalent bond radius than silicon for imparting a tension to the X-ray transmissive layer. The silicon rib is doped with an impurity element having a covalent bond radius larger than silicon. The critical disadvantage in this X-ray lithography mask is that the mask is opaque to visible light and hence mask alignment using visible light or laser beam is impossible.

Another prior art mask is disclosed in U.S. Pat. No. 3,742,229. This mask utilizes transmissive X-rays to align the mask in an accurate position on an object such as semiconductor substrate. This X-ray lithography method however is not practical for manufacturing semiconductor devices. This is due to the fact that heavy metal such as gold, formed on the semiconductor substrate as an alignment pattern degrades the performance of the semiconductor device when the substrate is subjected to high temperature processes such as a CVD process subsequent to the X-ray lithography process. Moreover, a portion of the substrate on which the gold pattern is formed must be so thin so as to transmit the X-rays for alignment. Therefore treatment of the substrate becomes difficult.

Another prior art X-ray lithography mask is proposed in "SOLID STATE TECHNOLOGY," Sept. 1976, pages 55 to 58, and in the "IBM TECHNICAL DISCLOSURE BULLETIN," May, 1976, No. 12, Vol. 18, pages 4210 to 4211 by E. Bussous et al. According to this method, the membrane is formed by laying a silicon oxide on a silicon nitride layer, and then chromium and gold double layers are laid on the silicon oxide layers. In this case, the chromium and gold double layer are extremely thin, so that they are somewhat transparent to visible light. However, this structure is low strength, and hence fails to provide a large pattern.

It is therefore an object of the present invention to provide an X-ray lithography mask, which enables accurate and easy mask alignment.

It is a further object of the present invention to provide a large pattern X-ray lithography mask.

It is another object of the present invention to provide a method for manufacturing an effective X-ray lithography mask with conventional semiconductor device processing methods.

SUMMARY OF THE INVENTION

In accordance with one feature of the invention, there is provided an X-ray lithography mask which includes a thick silicon peripheral rib with a window formed therein and a multi-layered membrane transparent to X-rays and visible light supported by the rib and covering the window. The membrane consists essentially of at least two silicon nitride layers and at least one silicon oxide layer sandwiched between the silicon nitride layers. The silicon nitride layers are preferably positioned at opposite surfaces of the multi-layered membrane. The membrane may support both an alignment pattern absorbing at least visible light and a transfer pattern absorbing X-rays. A plurality of windows may be provided in the supporting rib and the alignment pattern may be formed on a portion of the membrane covering one window, while the transfer pattern may be formed on another portion of the membrane covering one or more other windows. The membrane may consist of first silicon nitride layer attached to a silicon peripheral rib, a silicon oxide layer formed on the first silicon nitride layer, and a second silicon nitride layer formed on the silicon oxide layer, in which the thickness of each silicon nitride layer preferably ranges from 0.1 $\mu$m to 0.5 $\mu$m and the thickness of the silicon oxide layer preferably ranges from 0.4 $\mu$m to 2.5 $\mu$m. The total thickness of the membrane preferably ranges from 0.6 $\mu$m to 5.0 $\mu$m. The thickness of the silicon nitride layers and the silicon oxide layer are determined by the coefficient of thermal expansion and the strength of the membrane. The total thickness of the membrane is determined by required strength and the transmissibility of X-rays, visible light or laser beam.

In accordance with another aspect and feature of the present invention, there is provided a method for manufacturing an X-ray lithography mask, comprising the steps of: forming silicon nitride layers on both surfaces of a silicon substrate; etching one of the silicon nitride layers to a desired pattern so as to provide an etching mask which is subsequently used when forming a silicon supporting rib; alternately laminating a desired number of layers of silicon oxide layers and a silicon nitride layers on the other silicon nitride layer in a manner that the final layer is a silicon nitride layer; forming on the final silicon nitride layer a X-ray absorbing layer of a desired pattern, and removing part of the silicon substrate by using the etching mask formed on the silicon nitride layer in a manner that the other silicon nitride layer formed in the preceding step may be exposed, thereby forming a rib adapted to support the membrane composed of the silicon nitride and silicon oxide layers.

The advantages of the present invention are as follows:

(i) The transfer mask of the instant invention allows rough alignment by using visible light. Fine alignment is achieved by using a laser beam of visible light or X-rays. When alignment utilizing visible light is applied to a prior art structure, the P+ silicon layer, forming the X-ray transmissive layer must be reduced in thickness. If the thickness of the P+ silicon layer is reduced, then alignment becomes possible by utilizing a visible light. However, with the prior art manufacturing technique is difficult to achieve a P+ silicon layer of a reduced thickness and also it is difficult to practice on a production scale. In contrast, according to the structure of the present invention, even if the total thickness of silicon oxide and silicon nitride is increased to as large as 5 $\mu$m, the structure remains transparent, while insuring desired mechanical strength and ease of handling. Thus, a submicron pattern itself consisting of an opaque layer functions as a mark for alignment, so that an alignment check point may be arbitrarily selected, with the result that accuracy of alignment and operability are both much improved. Stated differently, the selection of silicon oxide and silicon nitride, which are transparent to X-rays and visible light leads to the advantages achieved with the instant invention.

In addition, according to the structure of the present invention, the attenuation of X-rays by the membrane may be reduced to an extent similar to that achieved in the prior art structure. Silicon provides small attenuation coefficients of absorption to the K$\alpha$ spectrum of aluminum (wave length 8.34Å) which is normally used in the X-ray exposing process, i.e., an attentuation coefficient of absorption on the order 0.53 dB/$\mu$m. Accordingly, silicon is an excellent X-ray transmissive material. However, the X-ray attenuation of both silicon nitride and silicon oxide are also as small as about 1.15 dB/$\mu$m at 8.34Å wavelength. When comparing this value with that of silicon, the value is in fact twice as high as that of silicon. Fortunately, however, the absolute values thereof are small. Accordingly, taking the whole structure into consideration, the loss attributable to the membrane is essentially and negligible.

(ii) According to the present invention, the membrane has a multi-layer structure, in which a silicon oxide layer, having a coefficient of thermal expansion about 1/17smaller than that of silicon, is sandwiched between silicon nitride layers having a coefficient of thermal expansion about 1.6 times greater than that of silicon. As a result, the coefficient of thermal expansion of the membrane is close to that of silicon. In addition, the membrane may have a tension of a desired value which cannot be achieved by the addition of boron at a high concentration as in the prior art. Also improved mechanical deformation may be well compensated for, as compared with a mask consisting of an oxide layer, a nitride layer, and a thin metal layer in other prior art techniques. As a result, there is achieved a transfer mask which is highly accurate and easy to handle. In the case where this transfer mask is used for the manufacture of a super LSI, which essentially consists of silicon, the coefficient of thermal expansion of silicon, which is the object to be worked, may be equal to that of the mask pattern to be transferred. The result is that, the influence of local temperature differences and temperature changes may be offset not only in the manufacture of the transfer mask, but also in the use of a completed transfer mask. This improves the final accuracy and yield of the super LSI to be manufactured from this transfer mask.

Unlike the prior art mask, in which a single layer of silicon nitride is laid on a single layer of silicon oxide, a mask according to the present invention may provide strength greater than that of the prior art, so that the pattern area may be increased. Furthermore, the mask according to the present invention is further advantageous as compared with the sandwiched structure, in which a silicon nitride layer is sandwiched between silicon oxide layers. More particularly a three-layer structure of a silicon oxide layer, silicon nitride layer and silicon oxide layer, whose total thickness was 2$\mu$m, was compared with a three-layer structure according to the present invention consisting of a silicon nitride layer, silicon oxide layer and silicon nitride layer, whose total thickness was 2 $\mu$m. Many test pieces of transmissive layers, or membranes, 4mm$\times$4mm, were prepared for the above two types of structures, for and a hydrostatic-pressure-strength test was conducted. The structure having a sandwiched silicon nitride layer between silicon oxide layers achieved a value of 0.8 to 1.0 kg/cm$^2$, while the structure according to the present invention provided a value of 1.2 to 1.6 kg/cm$^2$. In the case where the thickness of a transmissive layer is constant and the transmissive layer surrounded by a rib is increased in area, the former structure could handle an area of 10mm×10mm, while the structure according to the present invention could easily handle an area of 15mm×15mm.

In addition, in the case where the thickness of the silicon nitride layer ranges between 0.1μm and 0.5μm, and the thickness of the silicon oxide layer ranges between 0.4μm and 2.5μm, there is achieved a transmissive layer having a well balanced coefficient of thermal expansion, and mechanical tension.

(iii) According to the present invention, membrane transparent to X-rays and visible light of a consistent quality and thickness can be manufactured, thus insuring excellent transfer accuracy. More particularly, when manufacturing a transfer mask of the aforesaid prior art structure, firstly a P+ layer of a thickness of 3 to 5μm, and a boron concentration of over $7 \times 10^{19}$ cm$^{-3}$ are formed on a silicon single crystal substrate according to a thermal diffusion process. Next a portion of a silicon substrate is removed by using an etching solution to provide a lower etching rate or speed, in the case of a silicon substrate containing boron at high concentration, or to provide a higher etching rate in the case of a silicon substrate containing small amounts of boron. The result is that an X-ray transmissive layer consisting of P+ material is left. However, according to this prior art technique, it is difficult to obtain a P+ layer affording a desired uniformity as the X-ray transmissive layer, and there is also a possibility of crystal defects being caused by the addition of boron at high concentrations. In addition, in the prior art, there often results a local difference in etching rate in the selective etching process. This results in the formation of an irregular surface the X-ray transmissive P+ layer, which should be of uniform thickness, thus failing to achieve desired transfer accuracy.

In accordance with another aspect of the invention, a transfer mask may be manufactured by depositing a silicon nitride layer, silicon oxide layer, and silicon nitride layer in this order by sputtering or chemical vapor deposition (CVD) technique on a silicon substrate which has been finished to a mirror surface, thereby forming a multilayer structure for a membrane, and then forming a X-ray absorbing layer on the membrane in a two dimensional pattern to be transferred, followed by removing such a portion of the silicon substrate, which hinders light transmitting through the aforesaid two dimensional pattern, from the back surface thereof, thereby providing silicon rib for supporting the membrane. An etching solution used for forming this supporting silicon peripheral rib should be at least of a selectable nature such that it etches silicon but does not etch silicon nitride. It is advantageous that the etching solution be a caustic potash solution of a 30% concentration at 90° to 120° C. The etching rate of this etching solution to silicon is about 100 to 350μm/hr, while its etching rate to silicon nitride is about several hundred Å/hr, with the result that the silicon rib may be reliably formed, and in addition, a clean silicon nitride interface may be obtained. The formation of a clean silicon nitride layer interface is mandatory in achieving positional uniformity for the transmission of X-rays or visible light including laser beams as well as for the removal of a mechanical deformations.

In addition, a silicon nitride layer which has been used as an etching mask in the process of forming the silicon rib can function not only as a protective film for the silicon rib but also as a film which compensates for mask wrap.

BRIEF DESCRIPTION OF THE DRAWINGS

FIG. 1 (B) is a cross-sectional view taken along the line B—B' in the direction of the arrows in FIG. 1 (A).

FIG. 3 (B) is a cross-sectional view taken along the line B—B' in the direction of the arrows in FIG. 3 (A).

DESCRIPTION OF THE PREFERRED EMBODIMENTS

Embodiment 1

Figure 1A:
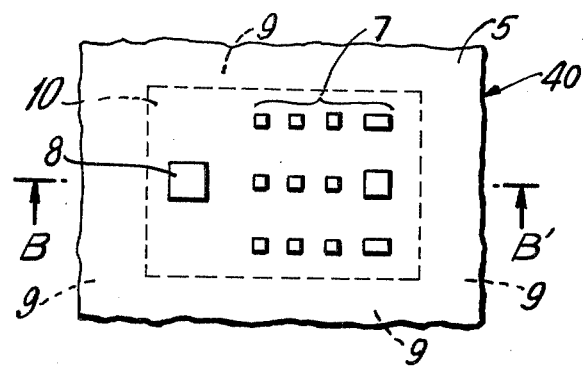
FIG. 1 (A) is a plan view of an X-ray mask according to a first embodiment of the invention.
Figure 1B:
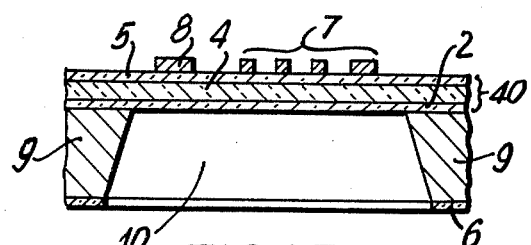

FIG. 1 shows a first embodiment of this invention. A window-10 is surrounded by a thick silicon peripheral rib 9. A membrane 40 which consists of a silicon nitride layer 2, a silicon oxide layer 4, and a silicon nitride layer 5 is supported by the rib 9, and the membrane covers the window 10. The thickness of the silicon nitride layers 2 and 5 ranges from 0.1μm to 0.5μm, and the thickness of the silicon oxide layer ranges from 0.4μm to 2.5μm. The total thickness of the membrane 40 ranges from 0.6μm to 5.0μm. Membrane 40 transmits X-rays and visible light including those produced by laser beams. The coefficient of thermal expansion of the membrane 40 is nearly equal to that of the silicon rib 9.

A transfer pattern 7, formed on the membrane 40, is made of a material having a high X-ray absorbing rate, such as Au, Pt, Cu, Cr and similar heavy metals. An alignment pattern 8, formed on the membrane 40 is also made of a material such as Au, Pt, and Cu. Alignment pattern 8 permits rough alignment by using visible light and fine alignment by using a laser beam, for example. Transfer pattern 7 can thus be transferred to an object, such as the semiconductor substrate of a VLSI, easily and accurately.

Refer now to FIG. 2 for an explanation of the method for manufacturing the X-ray lithography mask of the first embodiment. Both major surfaces of a (100) orientated silicon substrate 1 having a thickness of 200 to 500μm are finished to mirror surfaces. Silicon nitride layers 2 and 3 are formed on both surfaces of the silicon substrate 1 to a thickness of 0.1 to 0.5μm at a substrate temperature of 600° to 900° C. according to a CVD process (FIG. 2A).

Figure 2A:
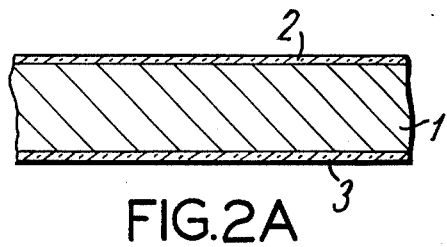
FIGS. 2 (A) through (D) are cross-sectional views taken at various process steps of the mask in the first embodiment.
Figure 2B:
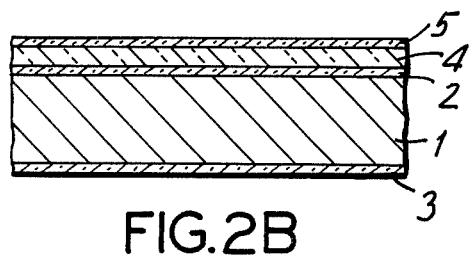

Next, a silicon oxide layer 4 is formed on the silicon nitride layer 2 to a thickness of 0.4 to 2.5μm according to a sputtering or CVD process. It is recommended however to use a sputtering process, because of the increased strength of the silicon oxide layer. A silicon nitride layer 5 is then formed on the silicon oxide layer 4 to a thickness of 0.1 to 0.5μm at substrate temperature of 600° to 900° C. according to a CVD process. (FIG. 2B). The three-layer structure consisting of layers 2,4,5 serves as a transmissive layer or a membrane.

Thereafter, the silicon nitride layer 3, formed on the back surface of the silicon substrate 1, is selectively removed according to a photo-etching process so as to leave a pattern 6 to serve as an etching mask in the later process of forming a silicon rib. FIG. 2. In this respect, a silicon nitride layer may be removed at a rate of several hundred A/min according to a low pressure gas plasma etching using a material such as $CF_4$, with a photo-resist (not shown) being used as a mask. This process of forming the etching mask 6 may be carried out immediately after the process of (FIG. 1 2A). However, it is preferable that the aforesaid process be applied before the absorbing pattern forming process, as will be described later.

Figure 2C:
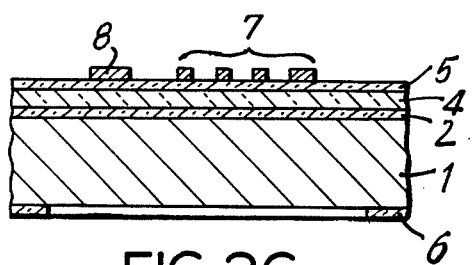
Figure 2D:
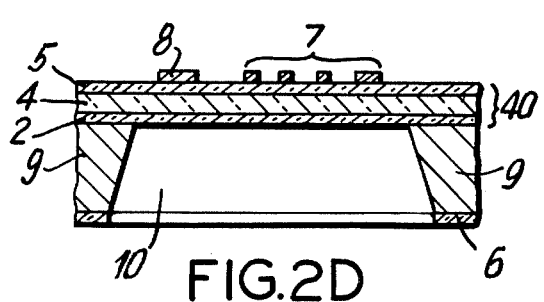

Subsequent to the foregoing, a metal layer having a high X-ray absorbing rate, such as Au, Pt, Cu and the like, is formed on the layer 5 to a thickness of 0.2 to $2\mu m$. Alternatively, an adhesion layer such as Ti, Cr, Ni and the like can be formed on the layer 5 to a thickness of 0.0005 to $0.1\mu m$, and then the metal layer having a high X-ray absorbing rate can be formed on the adhesion layer. Next an X-ray resist is deposited on the metal layer, and a desired transfer pattern or alignment pattern, or both, are delineated according to an electron beam exposing process. Alternatively, a photo-etching technique in combination with an ultra vilot ray process may be used. Thereafter, X-ray absorbing transfer pattern 7 and alignment pattern 8 or a combination thereof are formed according to ion-milling, low pressure gas plasma etching or a wet type etching technique, with the resist film being used as a mask (FIG. 2C). Next, part of the silicon substrate is etched in an anisotoropy etching solution, for instance, about 30% KOH heated to 100° C. to 110° C., with the silicon nitride layer 6 being used as a mask, to open window 10 and thereby form silicon ribs 9. Membrane 40, carrying patterns 7 and 8, is thereby completed in accordance with one embodiment of the invention. According to the above etching solution, silicon may be etched at a rate of about $300\mu m/hr$, while silicon nitride is etched at a rate of only about 100 Å/hr, so that the etching is completely prevented along the interface of silicon nitride layer 2, and yet silicon may be removed completely. The silicon nitride layer 6, which has been used as an etching mask, serves as a protective layer for the silicon rib 9.

Another layer such as a silicon oxide layer may be interposed between the surface of the rib 9 and the membrane 40 to improve mechanical bonding therebetween. In this case, such a layer is formed on the silicon substrate 1 before deposition of the silicon nitride layer 2 and is selectively back-etched to expose the silicon nitride layer 2 at the windows.

Embodiment 2

Figure 3A:
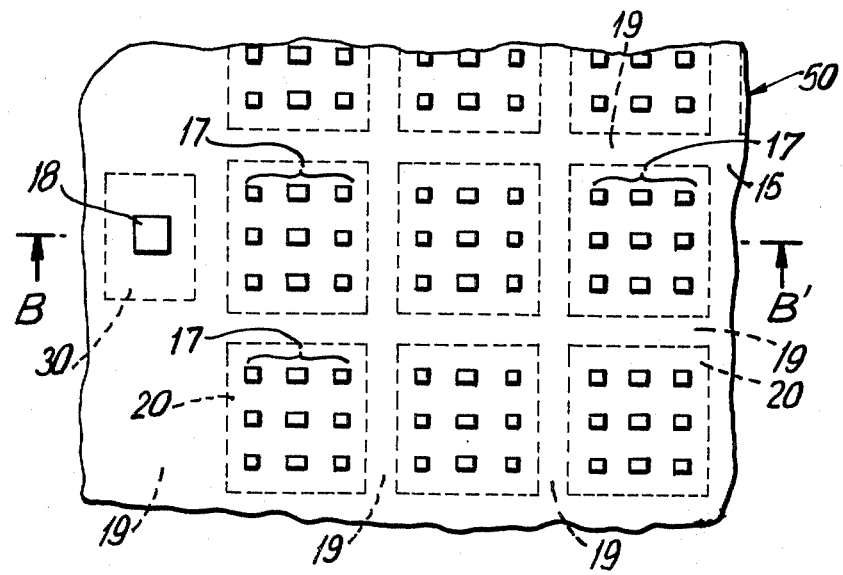
FIG. 3 (A) is a plane view of a mask of a second embodiment of the invention.
Figure 3B:
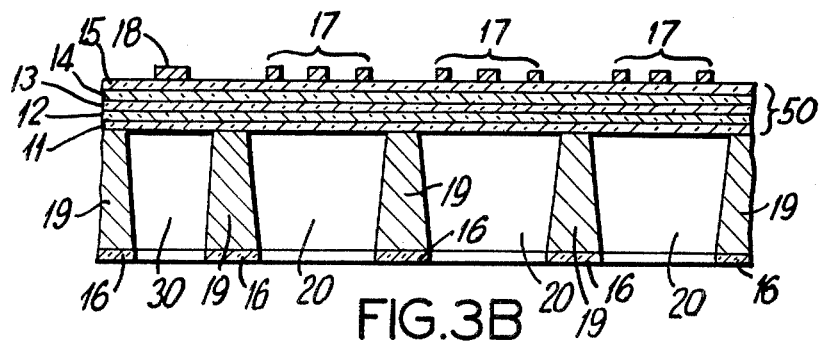

FIG. 3 shows a second embodiment of the invention. A first window 30 and a number of second windows 20 are formed in and surrounded by a thick silicon peripheral rib 19. A membrane 50, which consists of three silicon nitride layers 11, 13, 15 and two silicon oxide layers 12, 14 each sandwiched between silicon nitride layers, is supported by the silicon rib 19, and covers the windows 30 and 20. The thickness of the membrane 50 is preferably below about $5\mu m$ so as to effectively transmit X-rays and visible light and above $0.6\mu m$ so as to maintain strength.

An alignment pattern 18, of the same material as the embodiment 1, is formed on the membrane 50 covering the first window 30, and transfer patterns 17, also of the same material as embodiment 1 are formed on the membrane 50 to cover the second windows 20. A silicon nitride layer 16, which has been used as an etching mask, serves as a protective layer for the silicon rib 19.

In the embodiments described, membrane 40 and 50 is of a three-or five-layer structure, but the present invention is not limited to such a structure. For example a seven-or more-layer structure can also be included in the technical scope of the invention. According to the invention the process for forming a silicon nitride layer or a silicon oxide layer should not necessarily be limited to a sputtering process or a CVD process. However, the selection thereof should depend on temperature, crystalline property of deposited layers, elongation of lattice constant, and variation in density. Moreover, the X-ray utilized is not limited to $K\alpha$ spectrum of aluminum. Other X-rays such as K spectrum of silicon, L spectrum of Molybdenum, and the like can be used in this invention. Although specific embodiment of this invention have been shown and described, it will be understood that various modifications may be made without departing from the spirit of the invention.

We claim:

1. A method for manufacturing an X-ray lithography mask, said method comprising the step of:
   forming silicon nitride layers on the both surfaces of a silicon substrate;
   selectively removing one of said silicon nitride layers to expose a portion of the surface of said silicon substrate at an intended window area;
   laminating one or more silicon oxide layer and one or more silicon nitride layer alternately on the other silicon nitride layer to a desired number of layers, in a manner that the final layer be a silicon nitride layer;
   forming on said final layer an X-ray absorbing layer of a predetermined pattern; and
   selectively removing the exposed portion of said silicon substrate to form a window therein to an extent that said other silicon nitride layer may be exposed, thereby forming a rib for reinforcing and supporting said desired number of layers.

2. A mask of X-ray lithography comprising; a support structure, a multi-layered membrane transparent to X-rays and visible lights and carried by said support structure and an X-ray absorber layer arranged in a predetermined pattern on said multi-layered membrane, said membrane consisting essentially of at least two silicon nitride layers and at least one silicon oxide layer put between silicon nitride layers, and said membrane having an exposed top surface formed of one of said silicon nitride layers and an exposed back surface formed of another of said silicon nitride layers.

3. The mask of claim 2, in which said support structure including a portion supporting said membrane, said portion being formed of silicon.

4. The mask of claim 2, further comprising another layer absorbing visible lights arranged in a pattern for alignment on said membrane.

5. An X-ray lithography mask comprising:
   a silicon peripheral rib having a window therein, a membrane supported by said silicon peripheral rib and covering said window, an alignment pattern formed on a portion of said membrane covering said window, and a transfer pattern formed on a portion of said membrane consisting essentially of laminated silicon nitride and silicon oxide layers are laminated alternately, silicon nitride layers being positioned on the opposite surfaces of said membrane, said alignment pattern being made of a material capable of absorbing visible lights, and said transfer pattern being made of an X-ray absorbing material.

6. An X-ray lithography mask of claim 5, in which said membrane consists of two silicon nitride layers and one silicon oxide layer.

7. An X-ray lithography mask of claim 6, in which a thickness of each of said silicon nitride and silicon oxide layers ranges from 0.1μm to 0.5μm and a thickness of said membrane ranges from 0.6μm to 5.0μm.

8. An X-ray lithography mask of claim 6, in which said alignment pattern and said transfer pattern are made of the same material.

9. An X-ray lithography mask of claim 8, in which said material is heavy metal.

10. An X-ray lithography mask comprising:
a silicon peripheral rib having therein a first window and a second window, a membrane supported by said silicon peripheral rib and covering said first window and said second window, an alignment pattern formed on a portion of said membrane covering said first window, a transfer pattern formed on another portion of said membrance covering said second window, said membrane being a laminate layer in which two or more silicon nitride layers and one or more silicon oxide layer are laminated and the silicon nitride layers are positioned on the outer sides thereof, said alignment pattern being made of a material capable of absorbing visible lights, and said transfer pattern being made of a material capable of absorbing X-rays.

11. An X-ray lithography mask of claim 10, in which a thickness of said membrane ranges from 0.6μm to 5.0μm.

12. An X-ray lithography mask of claim 10, in which said alignment pattern and said transfer pattern are made of the same material.

13. An X-ray lithography mask of claim 12, in which said material is made of heavy metal.

14. An X-ray lithography mask of claim 10, in which said membrane consists of two silicon nitride layers and one silicon oxide layer.

15. An X-ray lithography mask of claim 14, in which a thickness of the respective layers ranges from 0.1μm to 0.5μm and a thickness of said membrane ranges from 0.6μm to 5.0μm.

16. An X-ray lithography mask of claim 10, in which said membrane consists of three silicon nitride layers and two silicon oxide layers.

* * * * *